United States Patent
Hsieh

(10) Patent No.: US 9,329,453 B1
(45) Date of Patent: May 3, 2016

(54) OPTICAL PULSE ENERGY DIGITIZER

(71) Applicant: Rockwell Collins, Inc., Cedar Rapids, IA (US)

(72) Inventor: Han Chi Hsieh, Gaithersburg, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/817,006

(22) Filed: Aug. 3, 2015

(51) Int. Cl.
*H03M 1/00* (2006.01)
*G02F 7/00* (2006.01)
*H03M 1/12* (2006.01)

(52) U.S. Cl.
CPC ............... *G02F 7/00* (2013.01); *H03M 1/1245* (2013.01); *H03M 1/00* (2013.01); *H03M 1/12* (2013.01)

(58) Field of Classification Search
CPC .............. G02F 7/00; H03M 1/12; H03M 1/00
USPC .......................... 341/137, 155, 156, 120, 139
See application file for complete search history.

(56) References Cited

U.S. PATENT DOCUMENTS 5,859,392 A * 1/1999 Petty ........................ G06F 3/044
178/18.01

* cited by examiner

*Primary Examiner* — Joseph Lauture
(74) *Attorney, Agent, or Firm* — Angel N. Gerdzhikov; Donna P. Suchy; Daniel M. Barbieri

(57) ABSTRACT

Analog front-end circuits and methods for configuring analog front-end circuits to improve accuracy of optical pulse energy digitizers are disclosed. More specifically, an analog front-end circuit in accordance with the inventive concepts disclosed herein may be configured to reduce a pulse repetition rate as early in the front-end circuit as possible. It is contemplated that reducing the repetition rate in this manner provides more process time that may be allocated for data acquisition, hold, dump, or time guard bands, all of which may help to improve the measurement accuracy of the analog front-end circuit.

20 Claims, 2 Drawing Sheets

OPTICAL PULSE ENERGY DIGITIZER

GOVERNMENT LICENSE RIGHTS

This invention was made with government support under Government Contract No. NR0000-14-C-0206 awarded by the National Reconnaissance Office. The government has certain rights in the invention.

BACKGROUND

In optical electronics, photo-detected optical pulse energy is converted to a voltage signal through conversion circuits such as transimpedance amplifiers (TIAs). This type of conversion has found applications in high speed high resolution analog-to-digital converters (ADCs), free space optical communications, coherent optical communications and the like.

In a typical conversion process, pulses generated by a photodiode are converted from current pulses into voltage pulses prior to quantization. As data rates increase, the frequency of the pulses increases accordingly, and it is becoming more difficult to accurately measure the peak energy associated with each pulse when the frequency approaches or exceeds a certain level.

SUMMARY

In one aspect, embodiments of the inventive concepts disclosed herein are directed to an analog front end circuit of an optical pulse energy digitizer. The analog front end may include a temporal demultiplexer configured to demultiplex a current pulse stream generated by a photodiode into a plurality of demultiplexed current pulse streams. The analog front end may also include a plurality of current to voltage converters coupled with the demultiplexer. Each current to voltage converter may be configured to convert a particular demultiplexed current pulse stream of the plurality of demultiplexed current pulse streams to produce voltage signals to be provided as input to at least one quantizer.

In a further aspect, embodiments of the inventive concepts disclosed herein are directed to an analog front-end circuit of an optical pulse energy digitizer. The analog front-end circuit may include a demultiplexer configured to demultiplex a current pulse stream generated by a photodiode into a plurality of demultiplexed current pulse streams. The analog front-end circuit may also include a plurality of current to voltage converters coupled with the demultiplexer. Each current to voltage converter may be configured to convert a particular demultiplexed current pulse stream of the plurality of demultiplexed current streams to produce voltage signals. The analog front-end circuit may further include a plurality of quantizers coupled with the plurality of current to voltage converters. Each quantizer may be configured to receive the voltage signals produced by a particular current to voltage converter of the plurality of current to voltage converters and produce digital signals based on the voltage signals.

In another aspect, embodiments of the inventive concepts disclosed herein are directed to an optical pulse energy digitizer. The optical pulse energy digitizer may include a photodiode configured to convert pulsed optical signals to a current pulse stream, a demultiplexer configured to demultiplex the current pulse stream generated by the photodiode into a plurality of demultiplexed current pulse streams, and a plurality of current to voltage converters coupled with the demultiplexer. Each current to voltage converter may be configured to convert a particular demultiplexed current pulse stream of the plurality of demultiplexed current pulse streams to produce voltage signals. The optical pulse energy digitizer may also include a plurality of quantizers coupled with the plurality of current to voltage converters. Each quantizer may be configured to receive the voltage signals produced by a particular current to voltage converter of the plurality of current to voltage converters and produce digital signals based on the voltage signals.

It is to be understood that both the foregoing general description and the following detailed description are exemplary and explanatory only and are not restrictive of the inventive concepts disclosed and claimed herein. The accompanying drawings, which are incorporated in and constitute a part of the specification, illustrate embodiments of the inventive concepts and together with the general description, serve to explain the principles and features of the inventive concepts disclosed herein.

BRIEF DESCRIPTION OF THE DRAWINGS

The numerous objects and advantages of the inventive concepts disclosed herein may be better understood by those skilled in the art by reference to the accompanying figures in which.

DETAILED DESCRIPTION

Reference will now be made in detail to exemplary embodiments of the inventive concepts disclosed herein, examples of which are illustrated in the accompanying drawings.

Embodiments in accordance with the inventive concepts disclosed herein are directed to analog front-end circuits and methods for configuring analog front-end circuits to improve accuracy of optical pulse energy digitizers. More specifically, an analog front-end circuit in accordance with the inventive concepts disclosed herein may be configured to reduce a pulse repetition rate as early in the front-end circuit as possible. It is contemplated that reducing the repetition rate in this manner provides more process time that may be allocated for data acquisition, hold, dump, or time guard bands, all of which may help to improve the measurement accuracy of the analog front-end circuit.

Figure 1:
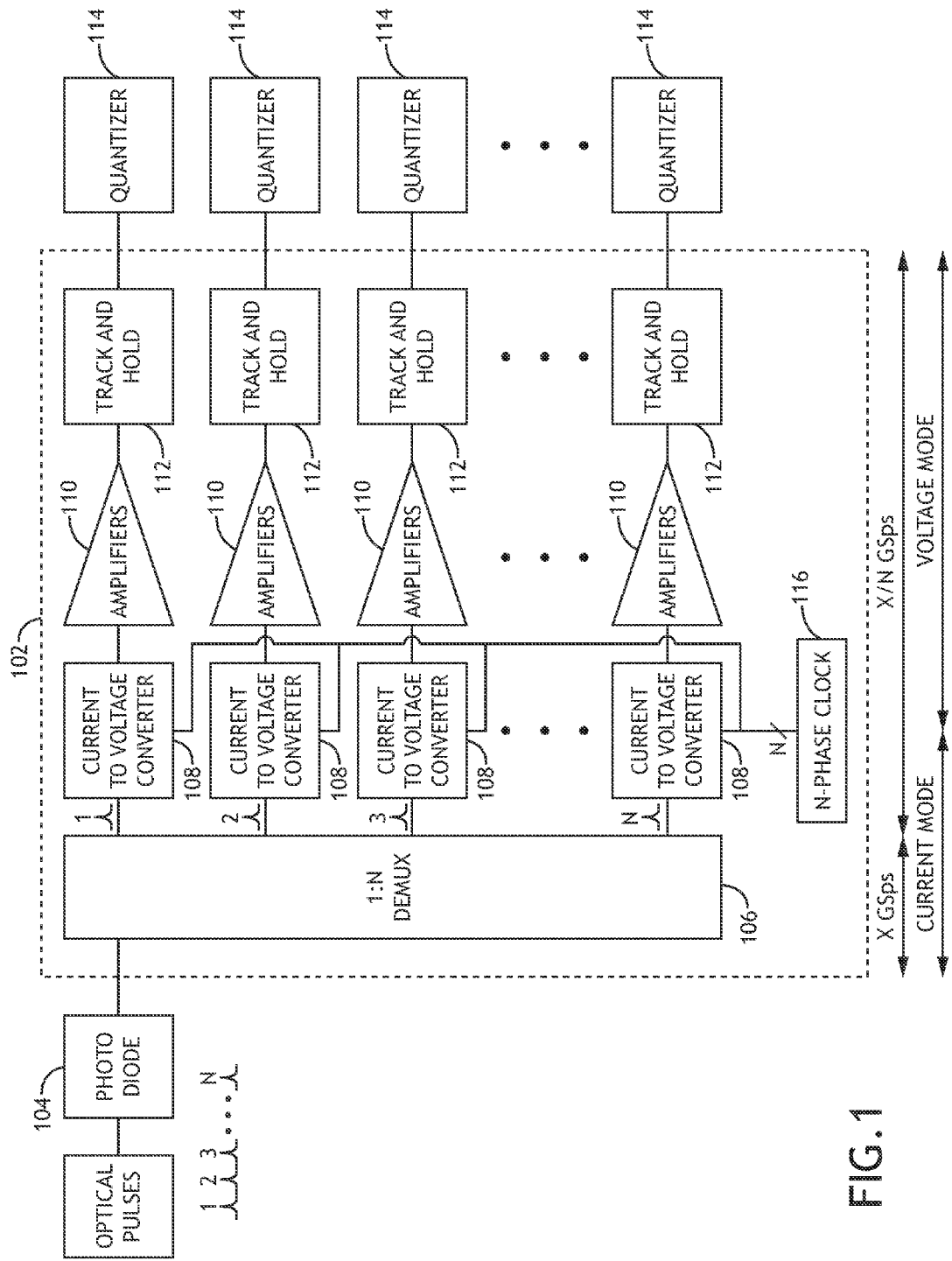
FIG. 1 is a block diagram depicting an optical pulse energy digitizer utilizing an analog front-end circuit according to an exemplary embodiment of the inventive concepts disclosed herein.

Referring to FIG. 1, a block diagram depicting an optical pulse energy digitizer 100 utilizing an analog front-end circuit 102 according to an exemplary embodiment of the inventive concepts disclosed herein is shown. The optical pulse energy digitizer 100 may include a photodiode 104 which may receive optical pulses and generate a stream of current pulses to be processed by the analog front-end circuit 102. The analog front-end circuit 102 may then convert the pulse stream generated by the photodiode 104 from current to voltage, which may then be digitized.

More specifically, the analog front-end circuit 102 configured in accordance with the inventive concepts disclosed herein may include a 1:N demultiplexer (demux) 106 configured to directly demultiplex the pulse stream generated by the photodiode 104 into N different channels. It is noted that demultiplexing the pulse stream generated by the photodiode 104 directly in a current mode (e.g., prior to voltage conversion) allows the demultiplexing process to be performed more quickly than demultiplexing in a voltage mode (e.g., after voltage conversion), where switch resistance may negatively affect switching speed and cause voltage swing. Demultiplexing in the current mode also makes the 1:N demultiplexer 106 easily scalable, which may be appreciated in various applications. Additionally, as illustrated in FIG. 1, the repetition rate (shown in FIG. 1 as X Giga samples per second as an example) of each channel after the 1:N demultiplexer 106 may be effectively lowered N times for all of the subsequent process blocks on that channel. As described below, reducing the repetition rate in this manner provides more available process time for the subsequent process blocks, which may improve measurement accuracy.

Once the pulse stream has been demultiplexed into N different channels, each particular channel may be processed independently utilizing a series of process blocks dedicated for that particular channel. In some embodiments, a current to voltage converter 108 (e.g., an integrate-and-dump circuit) may be utilized to convert the current received on a particular channel into a voltage signal. It is to be understood that since integrate-and-dump circuits are known in the field of signal processing, detailed schematics of integrate-and-dump circuits are not shown in FIG. 1. It is also to be understood that other types of circuits or process blocks capable of converting current into voltage may also be utilized instead of (or in addition to) the integrate-and-dump circuits, and the process block 108 may therefore be referred to generally as a current to voltage converter 108 without departing from the broad scope of the inventive concepts disclosed herein.

It is contemplated that each particular channel may also include one or more amplifiers 110 connected in series that may be utilized to condition the voltage signal generated by the current to voltage converter 108 on that particular channel. Additional process blocks, such as a track and hold circuit 112 or the like, may also be utilized to condition the voltage signal generated by the current to voltage converter 108 prior to providing the voltage signal to a quantizer 114 for digital conversion. Once again, since amplifiers 110, track and hold circuits 112, as well as quantizers 114 are known in the field of signal processing, detailed schematics of these components are not shown in FIG. 1 for simplicity.

Figure 2:
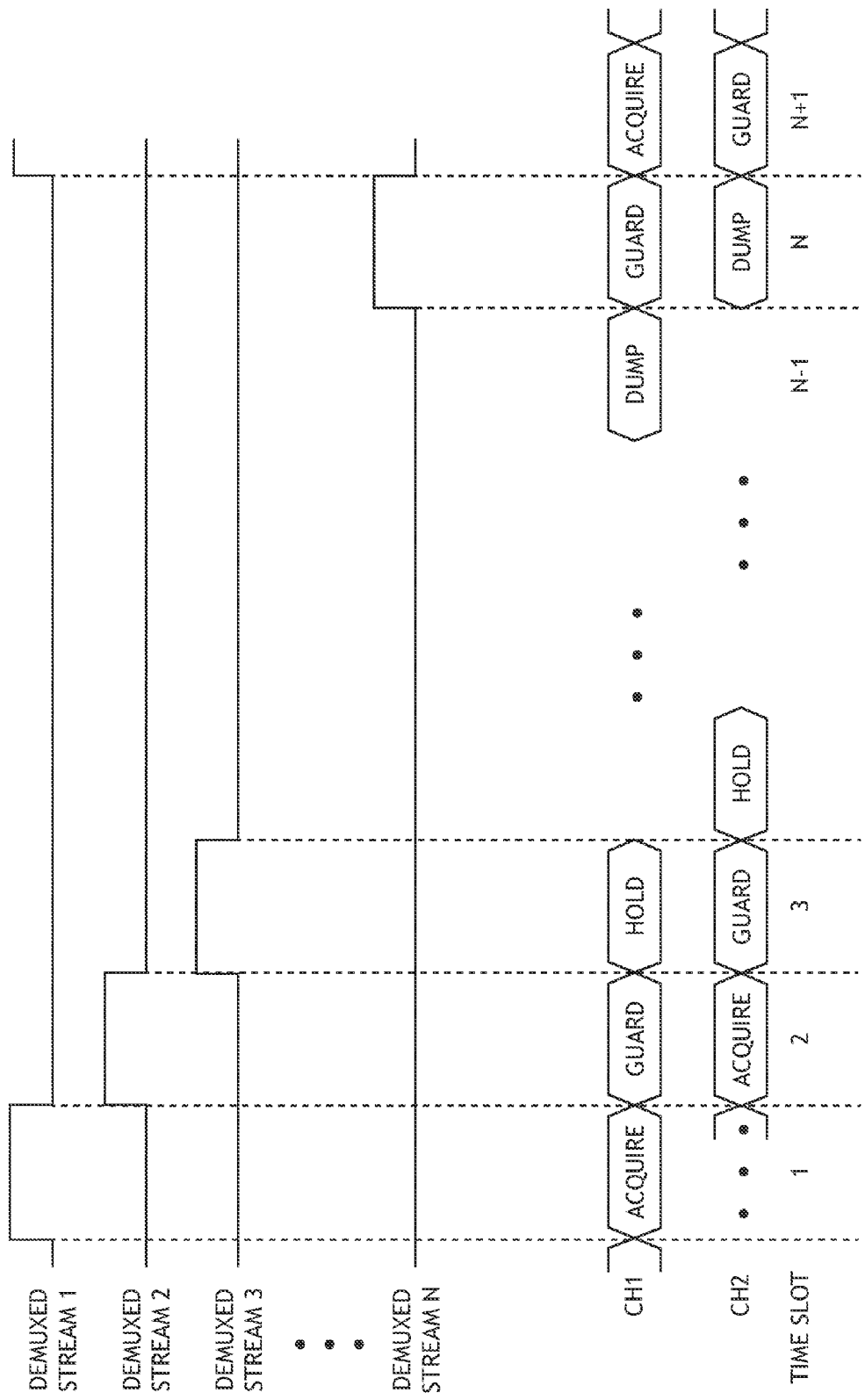
FIG. 2 is an exemplary timing diagram depicting an increase of available process time provided utilizing an analog front-end circuit according to an exemplary embodiment of the inventive concepts disclosed herein.

It is contemplated that while specific implementations of the process blocks 108, 110, 112, and 114 may vary, they may all be positioned after the 1:N demultiplexer 106 in the process flow to take the advantages provided by the 1:N demultiplexer 106. As the 1:N demultiplexer 106 is configured to directly demultiplex the pulse stream generated by the photodiode 104, the repetition rate on each channel after the 1:N demultiplexer 106 may be effectively lowered N times for all of the subsequent process blocks on that channel. FIG. 2 is an exemplary timing diagram depicting an increase of available process time provided utilizing an analog front-end circuit 102 according to an exemplary embodiment of the inventive concepts disclosed herein.

More specifically, the result of demultiplexing a pulse stream into N demultiplexed pulse streams is that the repetition rate on each demultiplexed pulse stream is now N times lower than the original pulse stream. This lowered repetition rate effectively means that each particular channel now has N times the original time unit between pulses on that particular channel, as illustrated in the timing diagram shown in FIG. 2.

Also shown in FIG. 2 are various functions that may now be assigned to the various time units made available for each channel. It is noted that more processing time may be allocated to certain functions as needed or desired, and these functions are not required to conform to the allocation scheme shown in FIG. 2. It is to be understood that allocations of processing time may be customized and/or adjusted to fit specific processing requirements. It is also possible to insert optional time guard bands to further improve measurement accuracy.

Referring back to the exemplary optical pulse energy digitizer 100 shown in FIG. 1, it is to be understood that while increasing the processing time allocated for holding a voltage and/or dumping the voltage in an integrate-and-dump circuit 108 may typically lead to improved measurement accuracy, time allocations may be optimized for specific operating conditions and therefore may vary without departing from the broad scope of the inventive concepts disclosed herein.

It is also contemplated that while various techniques may be utilized to provide clock signals to the various channels to control the timing, certain implementations of the analog front-end circuit 102 may utilize a single multi-phase clock 116 (as shown in FIG. 1) to provide synchronized controls for all channels. For instance, the single multi-phase clock 116 may be configured as an N-phase clock, which may be capable of distributing a clock signal to each of the N channels in the analog front-end circuit 102. It is contemplated that driving the various channels using the same N-phase clock 116 may help to provide well-defined phases for data acquisition, hold, dump, and time guard bands across the various channels, ensuring consistency and accuracy of the multi-channel front-end processes described above.

It is contemplated that an analog front-end circuit 102 configured in accordance with the inventive concepts disclosed herein may be utilized in various types of optical pulse energy digitizer, including photonic analog-to-digital converters (ADCs) and the like. Embodiments of the inventive concepts of the present disclosure may be implemented utilizing any combination of software and hardware technology and by using a variety of technologies without departing from the broad scope of the inventive concepts or without sacrificing all of their material advantages. It is to be understood that the specific order or hierarchy of steps in the processes disclosed is an example of exemplary approaches. It is to be understood that the specific order or hierarchy of steps in the processes may be rearranged while remaining within the broad scope of the present disclosure.

It is contemplated that various changes may be made in the form, construction, and arrangement of the components thereof without departing from the broad scope of the inventive concepts or without sacrificing all of their material advantages. The form herein before described being merely an explanatory embodiment thereof, it is the intention of the following claims to encompass and include such changes.

What is claimed is:

1. An analog front end circuit of an optical pulse energy digitizer, comprising:
   a demultiplexer configured to demultiplex a current pulse stream generated by a photodiode into a plurality of demultiplexed current pulse streams; and
   a plurality of current to voltage converters coupled with the demultiplexer, each current to voltage converter configured to convert a particular demultiplexed current pulse stream of the plurality of demultiplexed current pulse streams to produce voltage signals to be provided as input to at least one quantizer.

2. The analog front-end circuit of claim 1, further comprising:
   at least one track and hold circuit coupled with the plurality of current to voltage converters and configured to track and hold the voltage signals produced by each particular current to voltage converter of the plurality of current to voltage converters prior to providing the voltage signals as input to the at least one quantizer.

3. The analog front-end circuit of claim 1, further comprising:
   at least one amplifier coupled with the plurality of current to voltage converters and configured to condition the voltage signals produced by each particular current to voltage converter of the plurality of current to voltage converters prior to providing the voltage signals to the at least one quantizer.

4. The analog front-end circuit of claim 1, wherein the demultiplexer is a 1:N demultiplexer configured to lower a repetition rate of each particular demultiplexed current pulse stream of the plurality of demultiplexed current pulse streams N-times in comparison to a repetition rate of the current pulse stream generated by the photodiode.

5. The analog front-end circuit of claim 4, wherein each particular current to voltage converter of the plurality of current to voltage converters includes an integrate-and-dump circuit.

6. The analog front-end circuit of claim 5, wherein the integrate-and-dump circuit is allocated a process time for holding a voltage and a process time for dumping the voltage according to the repetition rate of each particular demultiplexed current pulse stream.

7. The analog front-end circuit of claim 1, further comprising:
   a multi-phase clock coupled with the plurality of current to voltage converters and configured to distribute a clock signal to each particular current to voltage converter of the plurality of current to voltage converters to control timing of each particular current to voltage converter.

8. An analog front-end circuit of an optical pulse energy digitizer, comprising:
   a demultiplexer configured to demultiplex a current pulse stream generated by a photodiode into a plurality of demultiplexed current pulse streams;
   a plurality of current to voltage converters coupled with the demultiplexer, each current to voltage converter configured to convert a particular demultiplexed current pulse stream of the plurality of demultiplexed current streams to produce voltage signals; and
   a plurality of quantizers coupled with the plurality of current to voltage converters, each quantizer configured to receive the voltage signals produced by a particular current to voltage converter of the plurality of current to voltage converters and produce digital signals based on the voltage signals.

9. The analog front-end circuit of claim 8, further comprising:
   at least one track and hold circuit coupled with the plurality of current to voltage converters and configured to track and hold the voltage signals produced by each particular current to voltage converter of the plurality of current to voltage converters prior to providing the voltage signals as input to the plurality of quantizers.

10. The analog front-end circuit of claim 8, further comprising:
    at least one amplifier coupled with the plurality of current to voltage converters and configured to condition the voltage signals produced by each particular current to voltage converter of the plurality of current to voltage converters prior to providing the voltage signals to the plurality of quantizers.

11. The analog front-end circuit of claim 8, wherein the demultiplexer is a 1:N demultiplexer configured to lower a repetition rate of each particular demultiplexed current pulse stream of the plurality of demultiplexed current pulse streams N-times in comparison to a repetition rate of the current pulse stream generated by the photodiode.

12. The analog front-end circuit of claim 11, wherein each particular current to voltage converter of the plurality of current to voltage converters includes an integrate-and-dump circuit.

13. The analog front-end circuit of claim 12, wherein the integrate-and-dump circuit is allocated a process time for holding a voltage and a process time for dumping the voltage according to the repetition rate of each particular demultiplexed current pulse stream.

14. The analog front-end circuit of claim 8, further comprising:
    a multi-phase clock coupled with the plurality of current to voltage converters and configured to distribute a clock signal to each particular current to voltage converter of the plurality of current to voltage converters to control timing of each particular current to voltage converter.

15. An optical pulse energy digitizer, comprising:
    a photodiode configured to convert optical signals to generate a current pulse stream;
    a demultiplexer configured to demultiplex the current pulse stream generated by the photodiode into a plurality of demultiplexed current pulse streams;
    a plurality of current to voltage converters coupled with the demultiplexer, each current to voltage converter configured to convert a particular demultiplexed current pulse stream of the plurality of demultiplexed current pulse streams to produce voltage signals; and
    a plurality of quantizers coupled with the plurality of current to voltage converters, each quantizer configured to receive the voltage signals produced by a particular current to voltage converter of the plurality of current to voltage converters and produce digital signals based on the voltage signals.

16. The optical pulse energy digitizer of claim 15, further comprising:
    at least one track and hold circuit coupled with the plurality of current to voltage converters and configured to track and hold the voltage signals produced by each particular current to voltage converter of the plurality of current to voltage converters prior to providing the voltage signals as input to the plurality of quantizers.

17. The optical pulse energy digitizer of claim 15, further comprising:
    at least one amplifier coupled with the plurality of current to voltage converters and configured to condition the voltage signals produced by each particular current to voltage converter of the plurality of current to voltage converters prior to providing the voltage signals to the plurality of quantizers.

18. The optical pulse energy digitizer of claim 15, wherein the demultiplexer is a 1:N demultiplexer configured to lower a repetition rate of each particular demultiplexed current pulse stream of the plurality of demultiplexed current pulse streams N-times in comparison to a repetition rate of the current pulse stream generated by the photodiode.

19. The optical pulse energy digitizer of claim 18, wherein each particular current to voltage converter of the plurality of current to voltage converters includes an integrate-and-dump circuit, and wherein the integrate-and-dump circuit is allocated a process time for holding a voltage and a process time for dumping the voltage according to the repetition rate of each particular demultiplexed current pulse stream.

20. The optical pulse energy digitizer of claim 15, further comprising:

a multi-phase clock coupled with the plurality of current to voltage converters and configured to distribute a clock signal to each particular current to voltage converter of the plurality of current to voltage converters to control timing of each particular current to voltage converter.

* * * * *